United States Patent
Makley et al.

(10) Patent No.: US 9,020,645 B2
(45) Date of Patent: Apr. 28, 2015

(54) COMBINED CONTROL LINES FOR DEVICE COOLING FANS

(75) Inventors: Albert Vincent Makley, Morrisville, NC (US); Timothy Samuel Farrow, Cary, NC (US); Omar Ali, Morrisville, NC (US); Marc Richard Pamley, Durham, NC (US)

(73) Assignee: Lenovo (Singapore) Pte. Ltd., Singapore (SG)

(*) Notice: Subject to any disclaimer, the term of this patent is extended or adjusted under 35 U.S.C. 154(b) by 462 days.

(21) Appl. No.: 13/434,236

(22) Filed: Mar. 29, 2012

(65) Prior Publication Data

US 2013/0261836 A1 Oct. 3, 2013

(51) Int. Cl.
*G06F 19/00* (2011.01)
*G06F 1/20* (2006.01)
*H05K 7/20* (2006.01)

(52) U.S. Cl.
CPC .............. *G06F 1/20* (2013.01); *H05K 7/20209* (2013.01)

(58) Field of Classification Search
USPC ........ 700/276, 300, 298; 62/176.6; 236/44 A, 236/44 C; 307/66, 65, 86, 81
See application file for complete search history.

(56) References Cited

U.S. PATENT DOCUMENTS

| | | | | |
|---|---|---|---|---|
| 5,019,717 | A * | 5/1991 | McCurry et al. ................. | 307/66 |
| 6,008,603 | A * | 12/1999 | Jones et al. ............... | 318/400.32 |
| 6,835,579 | B2 * | 12/2004 | Elward ............................ | 438/15 |
| 7,141,950 | B1 * | 11/2006 | Verge ........................ | 318/400.29 |
| 7,979,164 | B2 * | 7/2011 | Garozzo et al. ............... | 700/276 |
| 8,042,350 | B2 * | 10/2011 | Park et al. .................... | 62/259.2 |

* cited by examiner

*Primary Examiner* — Kidest Bahta
(74) *Attorney, Agent, or Firm* — John L. Rogitz; John M. Rogitz

(57) ABSTRACT

Described is a technology by which two or more air moving devices have some of their control lines combined, including a frequency control line from a controller. Along with the combined frequency control line, power voltage lines and ground lines and may be combined, with a separate sensing line for each air moving device. One or more couplers couples the combined lines to air moving device control circuitry.

20 Claims, 4 Drawing Sheets

COMBINED CONTROL LINES FOR DEVICE COOLING FANS

BACKGROUND

Some contemporary computing devices use two air moving devices (fans) to cool the various circuitry of the device. Typical computing devices use high-frequency pulse-width modulation controlled fans, in which each fan's operation is controlled by signals on a frequency control line sent from a controller component on the motherboard. Traditional high-frequency pulse-width modulation controlled fans are each driven by four total control lines, including the aforementioned controller-driven frequency control line, a control line for power (e.g., positive voltage), a control line for ground, and a tachometer line used for sensing rotational speed to check whether the fan is functioning properly.

In general, computer system designers aim to design smaller, more powerful computing devices at a lower cost. Any technology that consumes less computer motherboard space typically helps in board routing and the design of smaller and/or more computing devices that are more powerful/have more features. Further, any reduction in the number of components typically helps to lower the per-device cost. Thus, it is generally desirable to have fan technology that helps accomplish one or more of these aims.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, various aspects of the subject matter described herein are directed towards a technology by which signals from a controller control a plurality of air moving devices. A controller frequency line conducts frequency signals from a controller to a plurality of air moving devices via one or more couplers. A combiner combines a frequency line for each of the plurality of air moving devices with one another into a combined frequency line that connects to the controller frequency line. The combiner may be external to a circuit board on which the controller may reside, and/or on the circuit board.

In one aspect, air moving device control circuitry includes a controller and a sensor set. System circuitry is configured to receive data from the sensor set corresponding to air moving device failure, and is further configured to output a notification of the failure. A first line set comprises a first power voltage line, a first ground line, a first frequency line and a first sensing line, in which the first sensing line is coupled to the sensor set, and the first line set is coupled to a first air moving device for controllable operation of the first air moving device. A second line set comprises a second power voltage line, a second ground line, a second frequency line and a second sensing line, in which the second sensing line is coupled to the sensor set, and the second line set is coupled to a second air moving device for controllable operation of the second air moving device. The first frequency line is coupled to the second frequency line to provide a combined frequency line, and one or more couplers are configured to couple the combined frequency line to the air moving device control circuitry. The first power voltage line may be coupled to the second power voltage line to provide a combined power voltage line, and the first ground line may be coupled to the second ground line to provide a combined ground line. The one or more couplers may be further configured to couple the combined power voltage line and the combined ground line to a power source.

Further described is providing a device having a cooling system for cooling circuitry of the device, including by coupling a plurality of air moving devices to air moving device control circuitry. Each air moving device may be coupled to a line set of a plurality of lines sets, with each line set including a power voltage line, a ground line, a frequency line, and a sensing line. Described is combining the frequency lines of the line sets into a combined frequency line of a combined line set, and coupling the combined line set to the air moving device control circuitry.

Other advantages may become apparent from the following detailed description when taken in conjunction with the drawings.

BRIEF DESCRIPTION OF THE DRAWINGS

The present invention is illustrated by way of example and not limited in the accompanying figures in which like reference numerals indicate similar elements and in which.

DETAILED DESCRIPTION

Various aspects of the technology described herein are generally directed towards combining the control lines for air moving devices (e.g., fans) in a way that consumes less motherboard space relative to existing designs, and/or lowers component cost. To this end, at least one of the control lines to the fans may be coupled in a suitable way above (or below) the motherboard, thereby reducing the number of pins needed to couple the lines to the motherboard via a suitable connector. This saves space via a suitable connector. Moreover, if one of the control lines that is combined comprises the frequency line, then a single controller can provide the frequency signals for the plurality of fans, further reducing motherboard space and/or expense used for fan operation. Note that most hardware controllers have N+1 or N+2 tachometer lines, where N is the numbers of control lines.

In one example implementation, the positive voltage power lines of two (or more) fans are combined with one another, the ground lines of two (or more) fans are combined with one another, and the frequency lines of two (or more) fans are combined with one another, with only separate tachometer sensing lines to facilitate independent sensing of each fan. As will be understood, not only does this eliminate the need for two connectors and two fan controllers, but also reduces the number of pins (and thus correspondingly the size) of the connector, each of which help consume less motherboard space and cost.

It should be understood that any of the examples herein are non-limiting. For example, the technology described herein applies to any computing devices or appliances (e.g., television set-top boxes such as DVRs, audio receivers and so on)

that use a similar plurality of fans and fan control technology. Further, while two air moving devices in the form of fans are generally described in the examples, the technology may be applied to any air moving devices, and any practical number of air moving devices. As such, the present invention is not limited to any particular embodiments, aspects, concepts, structures, functionalities or examples described herein. Rather, any of the embodiments, aspects, concepts, structures, functionalities or examples described herein are non-limiting, and the present invention may be used various ways that provide benefits and advantages in controlled device cooling in general.

Figure 1:
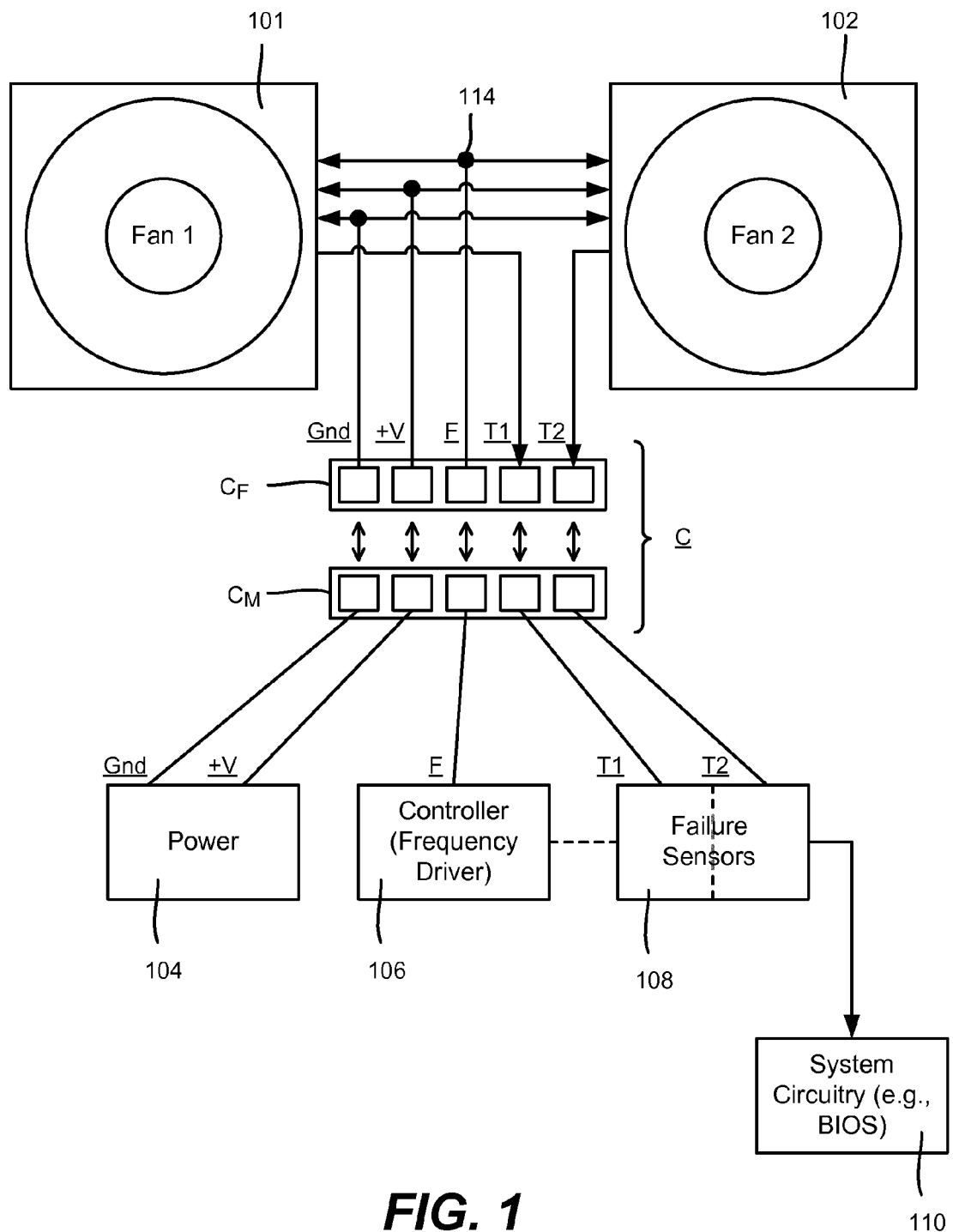
FIG. 1 is a block/wiring diagram showing components of a computing device configured with combined control lines for fans according to one example embodiment.

FIG. 1 shows an example implementation in which two fans 101 and 102 are operated via four control lines each, corresponding to ground (GND), positive voltage power (+V), frequency (F), and tachometer sensing lines (T1 and T2). The frequency line conducts signals that control the operation of the fan. The tachometer line provides rotational information for sensing proper fan operation; however as can be appreciated, such a sensing line may be replaced by any other type of sensing line, e.g., a line that simply carries signals indicating whether the device is currently operational or not.

Note that the term "control line" refers to the lines that are used to controllably operate and sense operation of the fans, (even though power lines or sensing lines may not be typically considered as controlling). As used herein, the term "control line" may be more simply referred to as a "line." Further, for brevity, the four control lines to each fan may be referred to herein as a "line set."

The fans 101 and 102 are coupled via one or more couplers (e.g., connector C) to various components/other lines, including to some suitable power source (including ground) as represented by block 104, a controller 106 that provides the frequency signals, and a failure sensors 108. The controller 106 may be a standalone component as generally represented in FIG. 1, or may be integrated into another component of the system circuitry, such as the chipset, the CPU or as part of another hardware controller.

In FIG. 1 the failure sensors 108 are shown as individual sensors combined into a single component, however the individual sensors may be in separate components. Note further that the failure sensors may be closely coupled to the controller 106 to differentiate fan failure versus the fan intentionally not being run. In general, fan failure is reported to system circuitry 110, e.g., the BIOS on a computer system, which sets a flag that is detected and used in an appropriate way, such as to output a notification to a user of the system, e.g., on the next reboot operation.

The illustrated connector C includes a separable fan portion $C_F$ and a motherboard portion $C_M$ that allows the fans 101 and 102 to detachably couple from the motherboard, e.g., for easy replacement in the event of fan failure or motherboard failure. The exemplified connector C includes five pins per portion $C_F$ and portion $C_M$ corresponding to the ground line, positive voltage line, frequency line and the two separate tachometer lines, one per fan.

As can be seen, by combining at least some of the fan lines in a suitable way, such as by splicing or otherwise coupling the line wiring above (or below) the motherboard, the number of pins used to control the two fans is reduced relative to existing technology in which the lines are all separate. In the example of FIG. 1, a single five pin connector is used as the one or more couplers instead of two four pin connectors, which saves space on the motherboard and generally reduces cost.

Moreover, a single controller 106 is used to output the signals for both fans 101 and 102 in this example implementation, in which both fans are to be driven at the same duty cycle, whereby both can use the same control algorithm. Note that as a result, only one controller is needed, further saving motherboard space and cost. If an alternative scenario needs separately controlled fans, separate controllers may be used, however a reduced pin connector may still be used by combining power-related lines of positive voltage and ground. Note however that in many situations, operating the fans at the same duty cycle is generally desirable, as it avoids noise-related and other issues such as acoustic beats that can be annoying to end users.

As represented in FIG. 1, a combiner 114 combines the individual frequency lines of the fans together so that a single controller 106 controls the operation of both fans. Similar structure (not separately labeled in FIG. 1) may combine the individual voltage lines to the fans and the individual ground lines to the fans. As used herein, the term "combiner" (singular) may represent any structure and/or mechanisms by which the frequency lines are combined, by which the voltage lines are combined, and/or by which the ground lines are combined, e.g., a "combiner" may be considered as combining one, two or three such lines.

Figure 2:
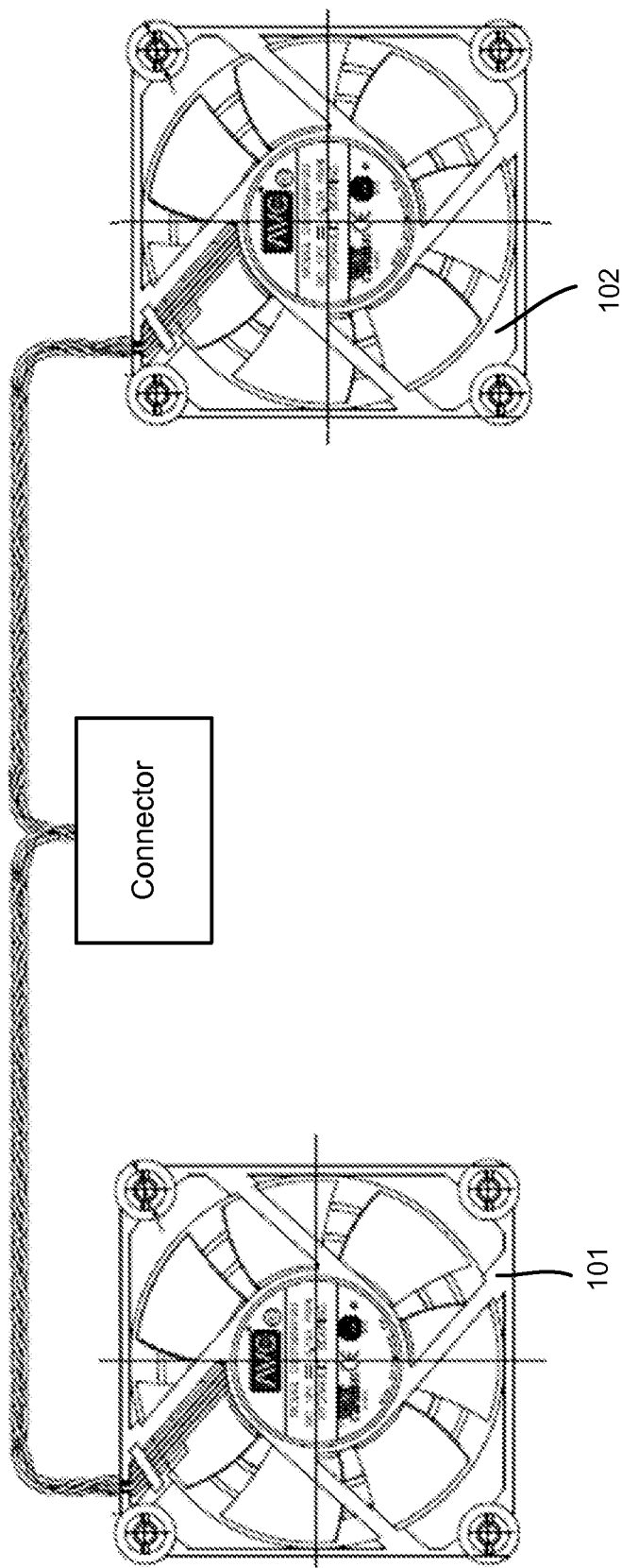
FIG. 2 is a representation of how two fans may have control lines combined according to one example embodiment.

FIG. 2 is a representation of how two fans 101 and 102 may have selected ones of their control lines combined. In this example, the lines (other than the tachometer lines) are combined by splicing the corresponding wires or merging them at the connector pins. As can be readily appreciated, a connector may be provided that accepts two wires per pin (at least those wires to be combined); in such an example, the combiner is integrated into the connector that also serves as the coupler.

The above examples describe a combiner that treats the fans as a unit except with respect to where each is physically positioned and how each is sensed. Thus, in the event one of the fans failed, both fans may need to be replaced (unless the user is able to recombine the lines of the replacement fan with the remaining fan). To facilitate replacement, instead of having a combiner in the form of splicing or merging wires at the pins, a detachable T-connector, Y-connector or the like that makes it easy to combine the desired wires may be used as the combiner, (instead of splicing or multiple-pin wire insertion), at a possibly higher cost. However, fans are relatively inexpensive and failure is relatively rare, and thus treating both as a unit with respect to replacement is a practical option.

Figure 3:
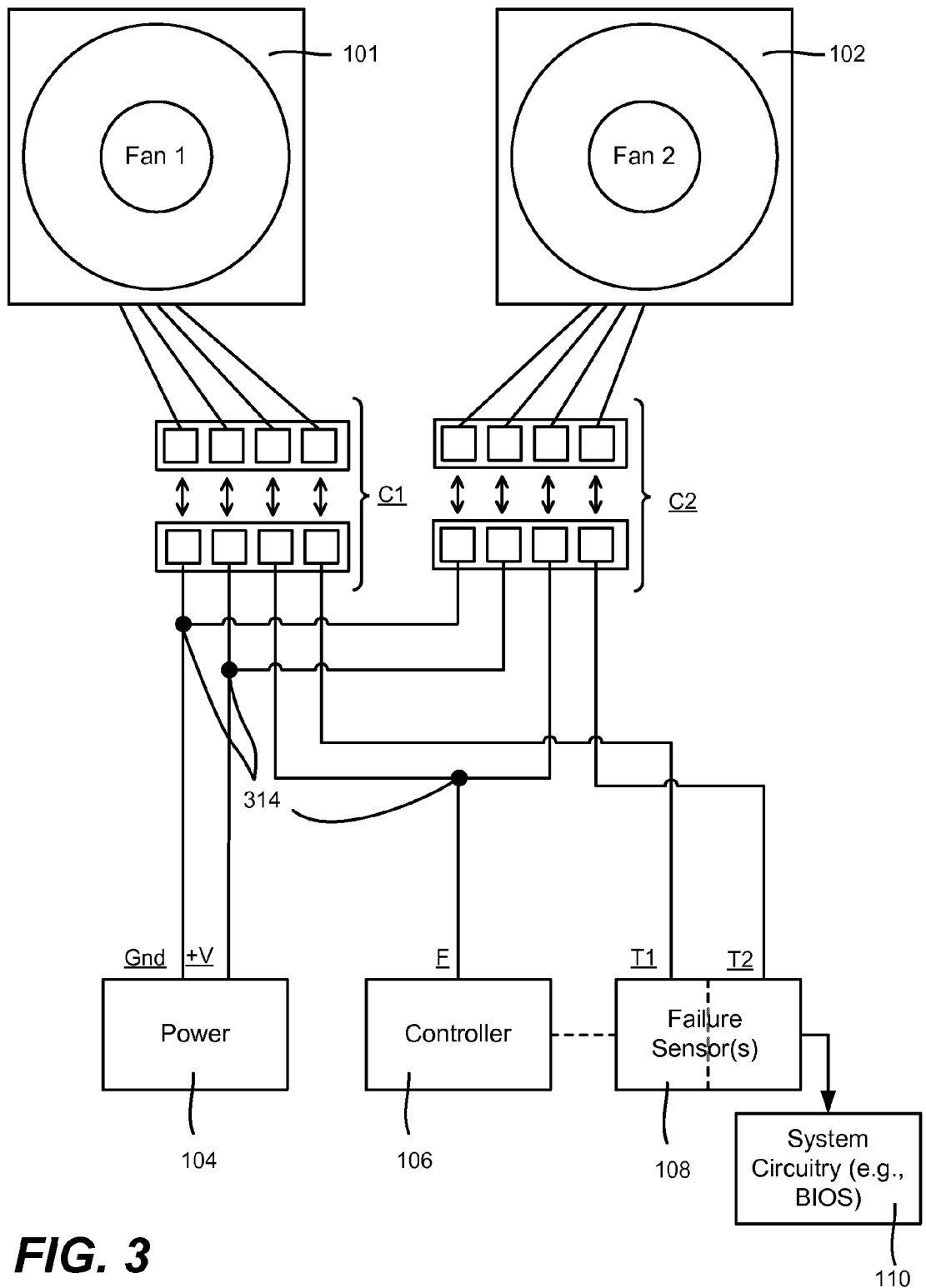
FIG. 3 is a block/wiring diagram showing components of a computing device configured with combined control lines for fans according to an alternative example embodiment.

Alternatively, FIG. 3 shows an implementation in which the expense of motherboard space and extra cost of the one or more couplers comprising two four-pin connectors C1 and C2 (e.g., versus one five-pin connector as in FIG. 1) is traded off in exchange for easy fan replacement. Note that the combining of the combined lines may be performed on the circuit board rather than external to the board as in FIGS. 1 and 2, that is, the combiner 314 comprises the circuit board traces or the like where the lines meet. As can be seen, although two connectors are used per line set, combining of the controller line F allows a single controller 106 to controllably operate both fans, thus providing desirable savings.

Example Environment

The term "circuit" or "circuitry" may be used in the summary, description, and/or claims. As is well known in the art, the term "circuitry" includes all levels of available integration, e.g., from discrete logic circuits to the highest level of circuit integration such as VLSI, and includes programmable logic components programmed to perform the functions of an embodiment as well as general-purpose or special-purpose processors programmed with instructions to perform those functions.

Figure 4:
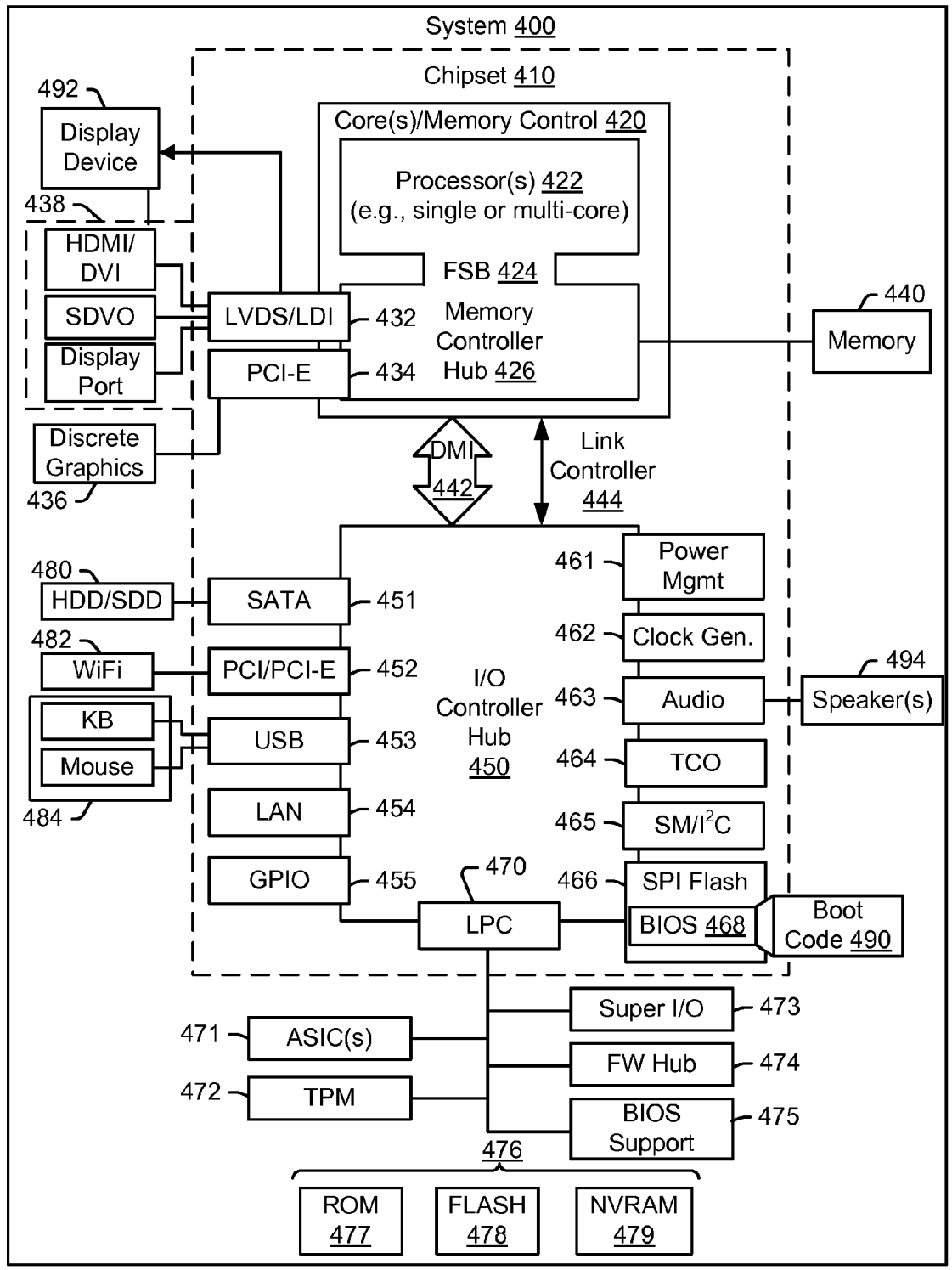
FIG. 4 is a block diagram representing an example computing environment into which aspects of the subject matter described herein may be incorporated.

While various example circuits or circuitry are discussed, FIG. 4 depicts a block diagram of an illustrative example computer system 400. The system 400 may be a laptop, tablet or desktop computer system, such as one of the ThinkCentre® or ThinkPad® series of personal computers sold by Lenovo (US) Inc. of Morrisville, N.C., or a workstation computer, such as the ThinkStation®, which are sold by Lenovo (US) Inc. of Morrisville, N.C.; however, as apparent from the description herein, a client device, a server or other machine may include other features or only some of the features of the system 400.

The system 400 of FIG. 4 includes a so-called chipset 410 (a group of integrated circuits, or chips, that work together, chipsets) with an architecture that may vary depending on manufacturer (e.g., INTEL®, AMD®, etc.). The architecture of the chipset 410 includes a core and memory control group 420 and an I/O controller hub 450 that exchange information (e.g., data, signals, commands, etc.) via a direct management interface (DMI) 442 or a link controller 444. In FIG. 4, the DMI 442 is a chip-to-chip interface (sometimes referred to as being a link between a "northbridge" and a "southbridge"). The core and memory control group 420 include one or more processors 422 (e.g., single or multi-core) and a memory controller hub 426 that exchange information via a front side bus (FSB) 424; noting that components of the group 420 may be integrated in a chip that supplants the conventional "northbridge" style architecture.

In FIG. 4, the memory controller hub 426 interfaces with memory 440 (e.g., to provide support for a type of RAM that may be referred to as "system memory"). The memory controller hub 426 further includes a LVDS interface 432 for a display device 492 (e.g., a CRT, a flat panel, a projector, etc.). A block 438 includes some technologies that may be supported via the LVDS interface 432 (e.g., serial digital video, HDMI/DVI, display port). The memory controller hub 426 also includes a PCI-express interface (PCI-E) 434 that may support discrete graphics 436.

In FIG. 4, the I/O hub controller 450 includes a SATA interface 451 (e.g., for HDDs, SDDs, etc.), a PCI-E interface 452 (e.g., for wireless connections 482), a USB interface 453 (e.g., for input devices 484 such as keyboard, mice, cameras, phones, storage, etc.), a network interface 454 (e.g., LAN), a GPIO interface 455, a LPC interface 470 (for ASICs 471, a TPM 472, a super I/O 473, a firmware hub 474, BIOS support 475 as well as various types of memory 476 such as ROM 477, Flash 478, and NVRAM 479), a power management interface 461, a clock generator interface 462, an audio interface 463 (e.g., for speakers 494), a TCO interface 464, a system management bus interface 465, and SPI Flash 466, which can include BIOS 468 and boot code 490. The I/O hub controller 450 may include gigabit Ethernet support.

The system 400, upon power on, may be configured to execute boot code 490 for the BIOS 468, as stored within the SPI Flash 466, and thereafter processes data under the control of one or more operating systems and application software (e.g., stored in system memory 440). An operating system may be stored in any of a variety of locations and accessed, for example, according to instructions of the BIOS 468. As described herein, a device may include fewer or more features than shown in the system 400 of FIG. 4.

While the invention is susceptible to various modifications and alternative constructions, certain illustrated embodiments thereof are shown in the drawings and have been described above in detail. It should be understood, however, that there is no intention to limit the invention to the specific forms disclosed, but on the contrary, the intention is to cover all modifications, alternative constructions, and equivalents falling within the spirit and scope of the invention.

What is claimed is:

1. A system comprising:
    a controller frequency line that conducts frequency signals from a controller to a plurality of fans via one or more couplers; and
    a combiner that combines a frequency line for each of the plurality of fans with one another into a combined frequency line that connects to the controller frequency line.

2. The system of claim 1 wherein the controller is supported by a circuit board and at least part of the controller frequency line comprises a circuit board trace, wherein the one or more couplers comprises a connector coupled to the circuit board trace and to the combiner, and herein the combiner is external to the circuit hoard.

3. The system of claim 2 wherein the connector comprises two detachable portions, including a circuit board connector portion coupled to the circuit board trace of the controller frequency line, and an air moving device connector portion having one or more pins corresponding to the frequency lines of the fans.

4. The system of claim 1 wherein the controller is disposed on a circuit board and at least part of the controller frequency line comprises a controller circuit board trace, wherein the one or more couplers comprises a plurality of connectors, one connector for each fan, in which the connector for each fan couples the frequency line of that fan to a separate circuit board trace for that connector, and wherein the combiner combines the separate circuit board traces for the plurality of connectors to the controller circuit board trace.

5. The system of claim 1 wherein the combiner combines a power voltage line for each of the plurality of fans with one another into a combined power voltage line, and that combines a ground line for each of the plurality of fans with one another into a combined ground line.

6. The system of claim 1 wherein the controller resides on a motherboard of a computing device and wherein the plurality of fans cools circuitry of the computer device.

7. A system comprising:
    air moving device control circuitry comprising a controller and a sensor set;
    system circuitry that receives data from the sensor set corresponding to air moving device failure, and that outputs a notification of the failure;
    a first line set comprising a first power voltage line, a first ground line, a first frequency line and a first sensing line, the first sensing line coupled to the sensor set, and the first line set coupled to a first air moving device for controllable operation of the first air moving device;
    a second line set comprising it second power voltage, line, a second ground line, a second frequency line and a second sensing line, the second sensing line coupled to the sensor set, and the second line set coupled to a second air moving device different from the first air moving device for controllable operation of the second air moving device:
    the first frequency line coupled to the second frequency line to provide a combined frequency line; and
    one or more couplers that couple the combined frequency line to the air moving device control circuitry.

8. The system of claim 7 wherein the controller resides on a circuit board, and wherein the one or more couplers include at least one connector that couples the combined frequency line to a circuit board trace to the controller.

9. The system of claim 8 wherein the sensor set includes a first failure sensor and a second failure sensor each residing on a circuit board, and wherein the one or more couplers include at least one connector that couples the first sensing line to a circuit board trace to the first failure sensor, and that couples the second sensing line to a different circuit board trace to the second failure sensor.

10. The system of claim 7 further comprising a power source, and wherein the first power voltage line is coupled to the second power voltage line to provide a combined power voltage line and the first ground line is coupled to the second ground line to provide a combined ground line, and wherein the one or more couplers couple the combined power voltage line and the combined ground line to the power source.

11. The system of claim 10 wherein the one or more couplers comprises a connector having a pin coupled to the combined power voltage line, a pin coupled to the combined ground line, a pin coupled to the combined frequency line, a pin for the first sensing line, and a pin for the second sensing line.

12. the system of claim 10 wherein the power source outputs power voltage coupled to a power voltage circuit board trace relative to ground coupled to a ground circuit board trace, and wherein the connector is configured, to couple the combined power voltage line to the power voltage circuit board trace, and the combined ground line to the ground circuit board trace.

13. The system of claim 10 further comprising one or more other line sets, each other line set comprising a power voltage line, ground line, frequency line and sensing line, each other line set coupled to another air moving device for controllable operation thereof, and the power voltage line of each other line set coupled to the combined power voltage line, the ground line of each other line set coupled to the combined ground line, and the frequency line of each other line set coupled to the combined frequency line.

14. The system of claim 7 wherein the one or more couplers include at least one separable connector each having a circuit board portion and an air moving device portion.

15. The system of claim 7 wherein the system circuitry comprises BIOS of a computing device.

16. A method comprising:
providing a device having a cooling system for cooling circuitry of the device;
coupling a plurality of air moving devices to air moving device control circuitry of the device having a cooling system, the air moving devices being from each other in that one air moving device can be operable when the other air moving device is not operable;
coupling each air moving device to a line set of a plurality of lines sets, each line set comprising a power voltage line, a ground line, a frequency line, and a sensing line;
combining the frequency lines of the line sets into a combined frequency line of it combined line set, and;
coupling the combined line set to the air moving device control circuitry.

17. The method of claim 16 further comprising:
combining the voltage lines into a combined voltage line of the combined line set; and
combining the ground lines into a combined ground line of the combined line set.

18. The method of claim 16 further comprising providing a connector having a pin shared by the combined frequency line.

19. The system of claim 18 wherein the connector includes an individual sensing line pin for each sensing line.

20. The system of claim 16 wherein combining the frequency lines comprises:
splicing the frequency lines together;
coupling the frequency lines together via a connector;
insetting the frequency lines into a connector that accepts multiple wires, or merging circuit board traces on a circuit board.

\* \* \* \* \*